(12) United States Patent
Tanaka

(10) Patent No.: US 9,468,106 B2
(45) Date of Patent: Oct. 11, 2016

(54) BONDING SYSTEM

(71) Applicant: Eiji Tanaka, Kanazawa (JP)

(72) Inventor: Eiji Tanaka, Kanazawa (JP)

(73) Assignee: SHIBUYA KOGYO CO., LTD., Kanazawa-shi, Ishikawa (JP)

( * ) Notice: Subject to any disclaimer, the term of this patent is extended or adjusted under 35 U.S.C. 154(b) by 354 days.

(21) Appl. No.: 14/161,958

(22) Filed: Jan. 23, 2014

(65) Prior Publication Data

US 2014/0259648 A1    Sep. 18, 2014

(30) Foreign Application Priority Data

Mar. 15, 2013    (JP) ................................. 2013-053685

(51) Int. Cl.
| | |
|---|---|
| *B23K 26/06* | (2014.01) |
| *H05K 3/30* | (2006.01) |
| *H01L 23/00* | (2006.01) |
| *B23K 26/08* | (2014.01) |

(52) U.S. Cl.
CPC ............... *H05K 3/303* (2013.01); *B23K 26/06* (2013.01); *B23K 26/0853* (2013.01); *H01L 24/75* (2013.01); *H01L 24/81* (2013.01); *H01L 2224/75263* (2013.01); *H01L 2224/81224* (2013.01); *H01L 2924/00014* (2013.01); *H01L 2924/12042* (2013.01); *Y10T 29/53178* (2015.01)

(58) Field of Classification Search
CPC ........... H01L 24/75; H01L 2021/6003; H01L 2021/60097; H01L 2021/60112; H01L 24/81; H01L 2924/00; H01L 2924/12042; H01L 2224/13099; H01L 2224/75263; H01L 2224/81224; H01L 2224/00014; B23K 26/06; B23K 26/0853

See application file for complete search history.

(56) References Cited

FOREIGN PATENT DOCUMENTS

| | | |
|---|---|---|
| JP | 3416979 B2 | 4/2003 |
| JP | 2010-129890 A | 6/2010 |
| JP | 2012089696 A * | 5/2012 |

* cited by examiner

*Primary Examiner* — Carl Arbes
(74) *Attorney, Agent, or Firm* — Flynn, Thiel, Boutell & Tanis, P.C.

(57) ABSTRACT

A bonding system 1 includes a plurality of laser resonators 7 and a plurality of optical fibers f1 to f36 each having a laser beam inlet connected to one of the plurality of laser resonators. The optical fibers are bundled, and laser beam outlets of the optical fibers are disposed so as to optically face a heating region S of an electronic component 3, and the heating region is irradiated with spots of laser beams emitted from the laser beam outlets. The heating region S is divided into at least corner sub-regions S1 at the corners of the electronic component and an inner sub-region S2 inside the electronic component, and the laser power of the laser resonators whose laser beam outlets face the corner sub-regions is set higher than the laser power of the laser resonators whose laser beam outlets face the inner sub-region.

6 Claims, 5 Drawing Sheets

BONDING SYSTEM

FIELD OF THE INVENTION

The present invention relates to a bonding system that bonds an electronic component to a substrate. In particular, the present invention relates to a bonding system suitable for bonding an electronic component having a polygonal shape to a substrate by heating the electronic component with a laser beam.

DESCRIPTION OF THE PRIOR ART

There is a known conventional bonding system that comprises a laser resonator that oscillates a laser beam, light guide means that guides the laser beam oscillated by the laser resonator and a tool base through which the laser beam guided by the light guide means is transmitted and bonds an electronic component having a polygonal shape to a substrate by heating the electronic component with the laser beam transmitted through the tool base (Patent Literature 1: Japanese Patent Laid-Open No. 2010-129890).

There is another conventional bonding system that can uniformly heat the whole of an electronic component by applying a laser beam to one surface of the electronic component to heat the whole of the surface and applying a laser beam to only a peripheral part of the other surface of the electronic component to heat the peripheral part of the electronic component, which tends to dissipate more heat (Patent Literature 2: Japanese Patent No. 3416979).

The bonding system according to Patent Literature 1 heats the electronic component by guiding the laser beam to one surface of the electronic component and therefore has an advantage that the electronic component can be heated in a state where the electronic component is pressed against the substrate. However, since the whole of the one surface of the electronic component is heated, in the case where the peripheral region of the electronic component tends to dissipate more heat than the inner region, it is difficult to uniformly heat the electronic component, and the temperature of the peripheral region of the electronic component is lower than that of the inner region.

The bonding system according to Patent Literature 2 can uniformly heat the whole of the electronic component, since the peripheral part of the electronic component, which tends to dissipate more heat, is additionally heated. However, both surfaces of the electronic component have to be irradiated with a laser beam, so that the electronic component cannot be heated in a state where the electronic component is pressed against the substrate.

For example, in the case where the electronic component having a polygonal shape is a rectangular electronic component, the four corner parts tend to dissipate more heat. However, the configuration of the bonding system according to Patent Literature 2 is not suitable for heating the four corner parts to a higher temperature than the other parts. Furthermore, an optical fiber 8 needs to be vertically displaced to change the point of application of the laser beam, and therefore, adjustments take a long time each time an IC chip 1 having a different thickness or made of a different material is placed in the bonding system.

SUMMARY OF THE INVENTION

In view of such circumstances, the present invention provides a bonding system that can extremely easily uniformly heat the whole of an electronic component from one side thereof.

Specifically, the present invention provides a bonding system that comprises: a laser resonator that oscillates a laser beam; light guide means that guides the laser beam oscillated by the laser resonator; and a tool base through which the laser beam guided by the light guide means is transmitted and bonds an electronic component having a polygonal shape to a substrate by heating the electronic component with the laser beam transmitted through the tool base, in which the laser resonator comprises a plurality of laser resonators, the light guide means comprises a plurality of optical fibers each having a laser beam inlet connected to one of the plurality of laser resonators, the plurality of laser resonators are associated with a heating region of the electronic component, and the heating region is irradiated with laser beams emitted from laser beam outlets of the plurality of optical fibers connected to the laser resonators and heated at irradiated parts, the heating region is divided into at least a corner sub-region at a corner of the electronic component and an inner sub-region inside the electronic component, and a laser power of laser resonators associated with the corner sub-regions is set higher than a laser power of a laser resonator associated with the inner sub-region.

With the configuration described above, the bonding system according to the present invention can heat the electronic component in a state where the electronic component is pressed against the substrate, since the bonding system has the tool base through which the laser beam is transmitted and heats the electronic component having a polygonal shape with the laser beam transmitted through the tool base.

In the case where the electronic component has a rectangular shape, for example, the four corner parts of the electronic component tend to dissipate more heat. However, of the plurality of laser resonators associated with the heating region of the electronic component, the laser power of the laser resonators associated with the four corner sub-regions is set higher than the laser power of the laser resonators associated with the inner sub-region, so that the four corner sub-regions, which tend to dissipate more heat, can be heated with a higher laser power. Therefore, the bonding system can extremely easily uniformly heat the heating region of the electronic component.

DETAILED DESCRIPTION OF THE EMBODIMENTS

Figure 1:
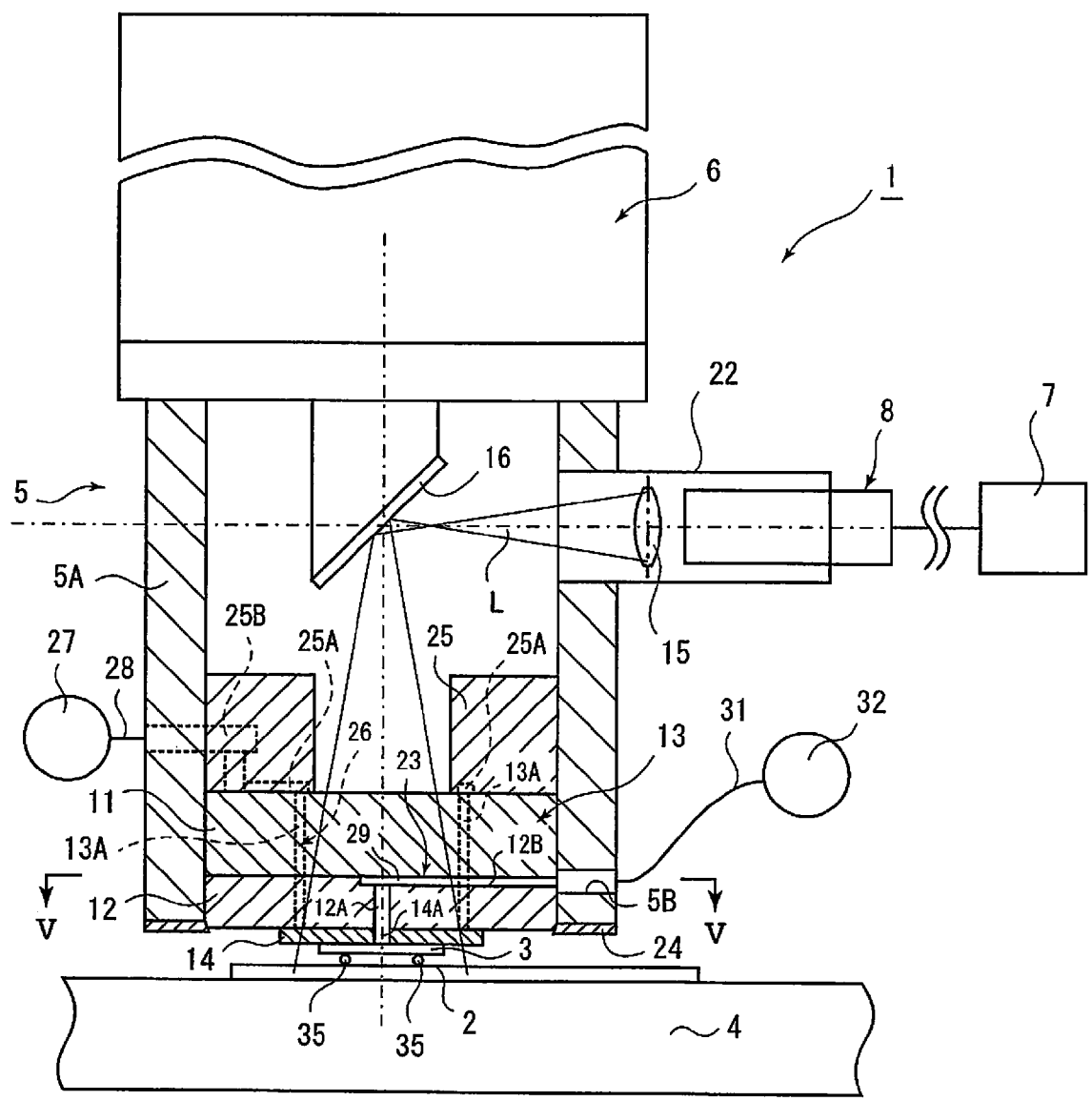
FIG. 1 is a cross-sectional view showing a first embodiment of the present invention.

In the following, embodiments of the present invention shown in the drawings will be described. Referring to FIG.

Figure 3:
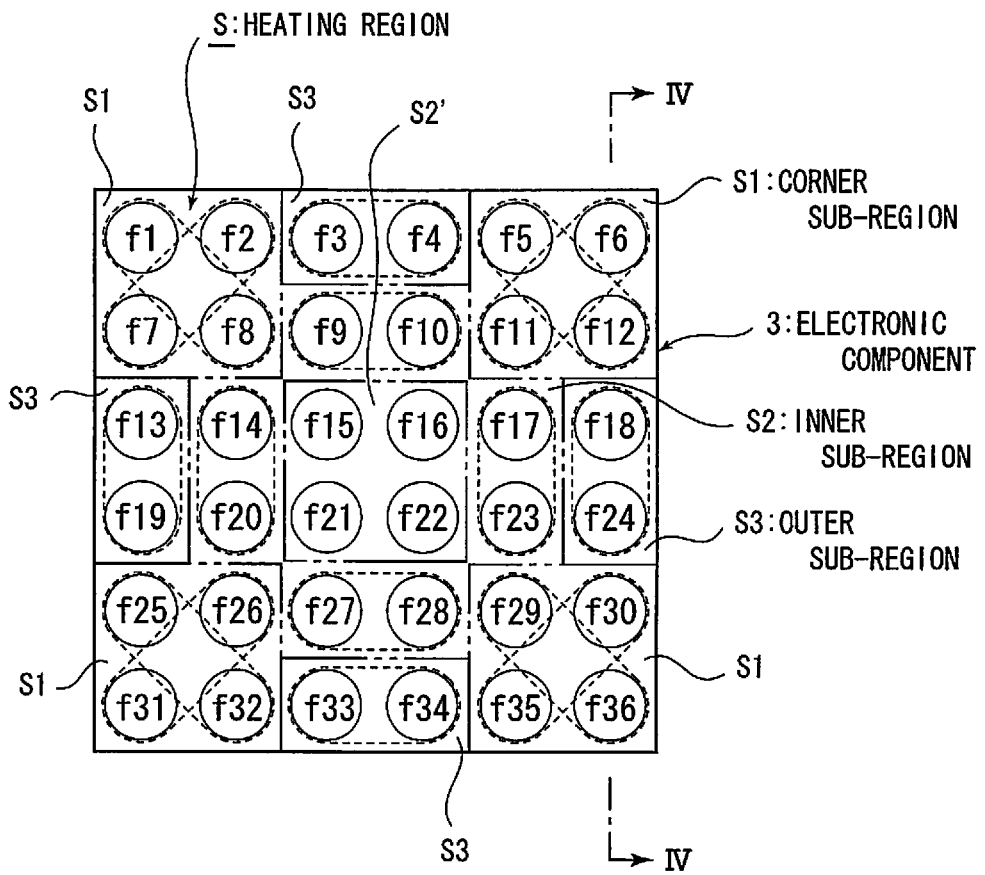
FIG. 3 is a diagram for illustrating a positional relationship between sub-regions S1 to S3 of an electronic component 3 and optical fibers f1 to f36.

1, a bonding system 1 according to an embodiment can bond an electronic component 3, such as a semiconductor chip, to a substrate 2. In this embodiment, as shown in FIG. 3, the electronic component 3 has a square shape. A heating region S in which the whole of the electronic component 3 is heated has a square shape that matches to the shape of the electronic component 3, and four corner parts of the square heating region S are referred to as corner sub-regions S1.

As shown in FIG. 1, the bonding system 1 comprises a substrate stage 4 that supports the substrate 2 and moves the substrate 2 in an X-Y direction in a horizontal plane, a bonding apparatus 5 disposed above the substrate stage 4, a pressure elevator mechanism 6 that elevates and lowers the bonding apparatus 5, a laser resonator 7 that oscillates a laser beam L, and light guide means 8 that guides the laser beam L oscillated by the laser resonator 7 into the bonding apparatus 5.

The bonding apparatus 5 has a cylindrical housing 5A, and a tool base 13, which is composed of two layers of transparent members 11 and 12, is fixed in a horizontal position to a lower end part of the housing 5A. A bonding tool 14 is removably held by suction to the lower surface of the tool base 13, and the electronic component 3 can be removably held by suction to the lower surface of the bonding tool 14.

A laser beam outlet, which is one end of the light guide means 8, is horizontally connected to an upper part of a side surface of the housing 5A, and a laser beam inlet, which is the other end of the light guide means 8, is connected to the laser resonator 7.

The laser beam L oscillated by the laser resonator 7 travels horizontally toward a center axis of the housing 5A through the light guide means 8 and is condensed to a required size by a condensing lens 15. The laser beam L horizontally guided is reflected vertically downwardly by a reflecting mirror 16 disposed at a center of an upper space in the housing 5A, transmitted through the tool base 13 and applied to the bonding tool 14 to heat the bonding tool 14. As a result, the electronic component 3 held by the bonding tool 14 is also heated.

The substrate stage 4, the pressure elevator mechanism 6 and the laser resonator 7 operate under the control of a controller (not shown). When the controller activates the laser resonator 7, the laser resonator 7 oscillates the laser beam L, and the laser beam L is guided into the bonding apparatus 5 through the light guide means 8 and applied to the bonding tool 14 to heat the bonding tool 14.

Figure 2:
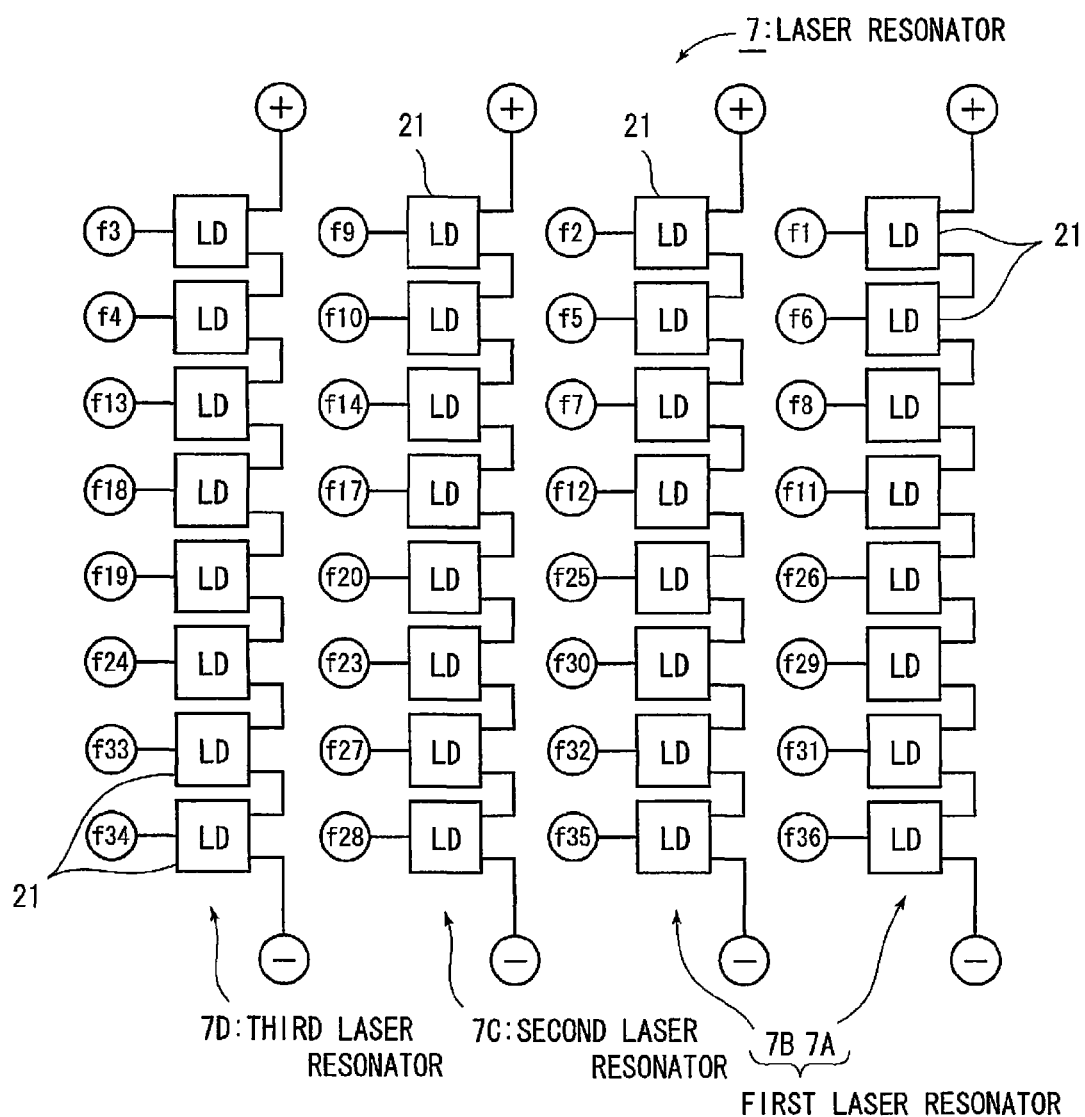
FIG. 2 is a diagram for illustrating a specific configuration of a laser resonator 7 shown in FIG. 1.

As shown in FIG. 2, the laser resonator 7 according to this embodiment comprises four laser resonators 7A to 7D, and each of the laser resonators 7A to 7D includes eight laser oscillating elements 21 arranged in series with each other. Therefore, the laser resonator 7 includes 32 laser oscillating elements 21 in total.

The eight laser oscillating elements 21 of each laser resonator are arranged in series with each other and connected to a power supply (not shown), and the four sets of eight laser oscillating elements 21 connected to separate power supplies can emit the laser beam L of the same power.

The two laser resonators 7A and 7B are both referred to as a first laser resonator, the laser resonator 7C is referred to as a second laser resonator 7C, and the laser resonator 7D is referred to as a third laser resonator 7D.

As described above, according to this embodiment, eight laser oscillating elements 21 are connected as a group in series with each other, so that the laser oscillating elements 21 can be controlled on a group basis and therefore can be easily controlled. In addition, since the number of power supplies can be reduced, the initial cost of the bonding system 1 can be reduced. In addition, since the power consumption can be reduced, the running cost can also be reduced.

According to this embodiment, the heating region S is divided into three types of sub-regions, which are the four corner sub-regions S1, an inner sub-region S2 inside the electronic component 3, and outer sub-regions S3 that are peripheral parts of the electronic component 3 other than the corner sub-regions S1 and the inner sub-region S2.

Of the first to third laser resonators, the first laser resonators 7A and 7B are set at a maximum power. Therefore, the bonding tool 14 can be heated with the maximum power, thereby indirectly heating the corner sub-regions S1 (FIG. 3) of the electronic component 3 with the maximum power.

On the other hand, the second laser resonator 7C can be set at a minimum power to heat the inner sub-region S2 inside the electronic component 3, and the third laser resonator 7D can be set at a medium power to heat the outer sub-regions S3.

Since the laser resonators 7A to 7D oscillate laser beams of different powers, the heating region S of the electronic component 3 can be heated as uniformly as possible. For example, the laser oscillating elements 21 of the first laser resonators 7A and 7B are configured to oscillate a laser beam of a power of 100%, the laser oscillating elements 21 of the third laser resonator 7D is configured to oscillate a laser beam of a power of 60 to 70%, and the laser oscillating elements 21 of the second laser resonator 7C is configured to oscillate a laser beam of a power of 20 to 40%.

As shown in FIG. 3, the light guide means 8 comprises a bundle of 36 optical fibers f1 to f36 having the same outer diameter. The laser beam L having passed through the light guide path of each optical fiber f1 to f36 can be guided to the bonding apparatus 5, and the resulting spots of light can be applied to the heating region S of the electronic component 3 to heat the whole of the region.

Laser beam outlets of the 36 optical fibers f1 to f36 are bundled and fixed in a cylindrical casing 22 horizontally attached to the upper part of the side surface of the housing 5A shown in FIG. 1 and connected in a horizontal position to the side surface of the housing 5A by the casing 22 to optically face the sub-regions S1 to S3 of the electronic component 3 through the condensing lens 15, the reflecting mirror 16 and the bonding tool 14.

More specifically, the laser beam outlets of the 36 optical fibers f1 to f36 are bundled in a 6 by 6 matrix in which the optical fibers are arranged at regular intervals in the vertical and horizontal directions. In the matrix, the optical fibers are numbered f1 to f36 in order from upper left to lower right. The 36 optical fibers f1 to f36 are divided into three groups in agreement with the three types of sub-regions S1 to S3 described above.

As shown in FIG. 3, four optical fibers are disposed so that the laser beam outlets thereof optically face each of the four corner sub-regions S1. More specifically, four optical fibers f1, f2, f7 and f8 are disposed to optically face the upper left corner sub-region S1, four optical fibers f5, f6, f11 and f12 are disposed to optically face the upper right corner sub-region S1, four optical fibers f25, f26, f31 and f32 are disposed to optically face the lower left corner sub-region S1, and four optical fibers f29, f30, f35 and f36 are disposed to optically face the lower right corner sub-region S1.

The sixteen optical fibers form a first group of optical fibers. Of the sixteen optical fibers forming the first group, eight optical fibers including four optical fibers f1, f6, f31 and f36 located at the outermost positions in the corner sub-regions S1 and four optical fibers f8, f11, f26 and f29 located at the innermost positions diagonally opposite to the optical fibers f1, f6, f31 and f36 in the respective corner sub-regions S1 are grouped as a set, and the laser beam inlets of these optical fibers are connected to the respective corresponding laser oscillating elements 21 of the first laser resonator 7A.

The remaining eight optical fibers f2, f5, f7, f12, f25, f30, f32 and f35 facing the corner sub-regions S1 are grouped as a set, and the laser beam inlets of these optical fibers are connected to the respective corresponding laser oscillating elements 21 of the first laser resonator 7B.

Therefore, the laser beams from the first laser resonators 7A and 7B set at the maximum power are applied to the four corner sub-regions S1 through the total of sixteen optical fibers of the first group.

As an alternative, the power of the first laser resonator 7A containing the laser oscillating elements 21 connected to the optical fibers f1, f6, f31 and f36 at the outermost positions of the four corners may be set slightly higher than the power of the first laser resonator 7B.

Of the remaining twenty optical fibers, 12 optical fibers f9, f10, f14 to f17, f20 to f23, f27 and f28 form a second group of optical fibers. The laser beam outlets of the optical fibers of the second group optically face the inner sub-region S2.

However, in this embodiment, a non-irradiation sub-region S2', which is not irradiated with any laser beam, is provided in a central part of the electronic component 3, and the laser beam outlets of the four optical fibers f15, f16, f21 and f22 of the second group of optical fibers located in the central part face the non-irradiation sub-region S2'. These four optical fibers do not need to emit a laser beam and therefore are not connected to the second laser resonator 7C.

On the other hand, the laser beam inlets of the remaining eight optical fibers f9, f10, f14, f17, f20, f23, f27 and f28 are connected to the second laser resonator 7C set at the minimum power (FIG. 3). Therefore, the laser beam from the second laser resonator 7C set at the minimum power is guided through the total of eight optical fibers of the second group to the inner sub-region S2 excluding the non-irradiation sub-region S2' and heats the inner sub-region S2 excluding the non-irradiation sub-region S2'.

As an alternative, the optical fibers f15, f16, f21 and f22 facing the non-irradiation sub-region S2' may be omitted.

The remaining eight optical fibers f3, f4, f13, f18, f19, f24, f33 and f34 form a third group of optical fibers. The laser beam outlets of the optical fibers of the third group optically face the outer sub-regions S3 (FIG. 3), and the laser beam inlets of the same optical fibers are connected to the third laser resonator 7D set at the medium power (FIG. 2).

Therefore, the laser beam from the third laser resonator 7D set at the medium power is guided through the total of eight optical fibers of the third group to the outer sub-regions S3 and heats the outer sub-regions S3.

Figure 4:
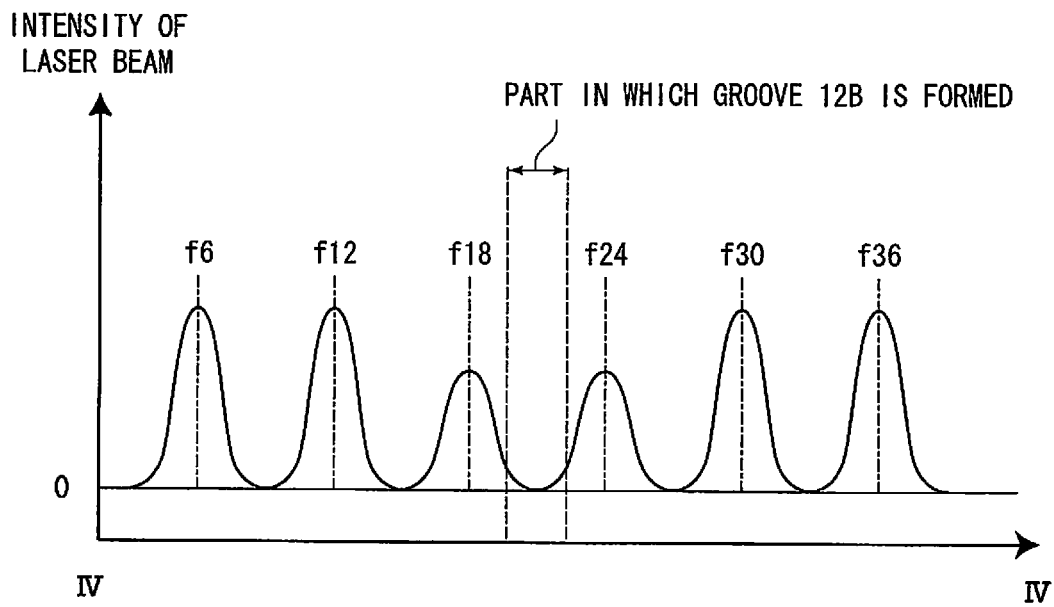
FIG. 4 is a diagram for illustrating an intensity distribution (beam profile) of each laser beam L in a cross section taken along the line IV-IV in FIG. 3.

In this embodiment, the intensity distribution (beam profile) of each laser beam L is a Gaussian mode (see f6, f12, f18, f24, f30 and f36 in FIG. 4). In the Gaussian mode, the spot of applied laser beam L has the highest intensity at the optical axis thereof and lower intensities around the optical axis. That is, the light intensity is low between adjacent laser beams L. Taking advantage of this characteristic, a groove 12B, which forms a chip suction channel 23 for the electronic component 3, is formed at a position between adjacent rows of laser beams L as described later.

Next, a configuration of the tool base 13 and surrounding components thereof will be described with reference to FIG. 1. The tool base 13 according to this embodiment has a stack structure including the transparent member 11 made of sapphire as an upper layer and the transparent member 12 made of quartz glass as a lower layer.

The transparent members 11 and 12 in the stacked state are fitted within the inner periphery of a lower end part of the housing 5A. The transparent member 12 is horizontally supported by an annular attachment member 24 with the lower surface thereof being approximately at the same level as the lower end surface of the housing 5A. The transparent member 11 is horizontally supported by an annular stopper 25 fitted in the housing 5A and pressed against the upper surface thereof. In this way, the transparent members 11 and 12 forming the tool base 13 are horizontally supported in the lower space in the housing 5A, and the lower surface of the transparent member 11 and the upper surface of the transparent member 12 are in air-tight contact with each other.

In this embodiment, a tool suction channel 26 is formed in the housing 5A, the stopper 25 and the tool base 13, and the chip suction channel 23 described above is formed in the housing 5A, the transparent members 11 and 12 and the bonding tool 14. The bonding tool 14 can be held by suction to the lower surface of the tool base 13 (the lower surface of the transparent member 12) by a negative pressure source 27 applying a negative pressure to the tool suction channel 26 through a conduit 28. The electronic component 3 can be held by suction to the lower surface of the bonding tool 14 held to the tool base 13 by a negative pressure source 32 applying a negative pressure to the chip suction channel 23 through a conduit 31.

Figure 5:
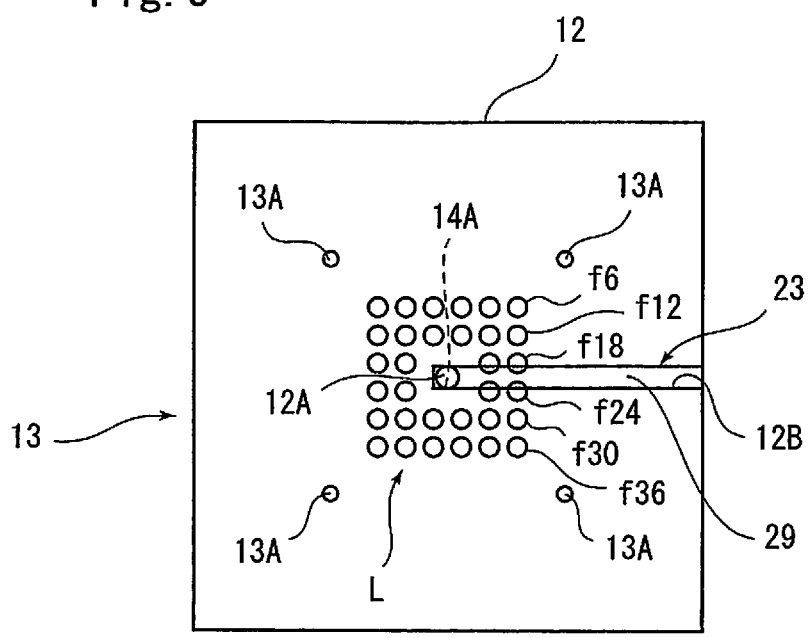
FIG. 5 is a cross-sectional view taken along the line V-V in FIG. 1.

As shown in FIGS. 1 and 5, four through-holes 13A are drilled in the upper and lower transparent members 11 and 12 (that is, the tool base 13) at positions corresponding to the four corners of the square bonding tool 14, and the upper ends of the four through-holes 13A are in communication with a groove 25A formed in the lower surface of the stopper 25. The groove 25A in the stopper 25 is connected to one end of the conduit 28 through an L-shaped communication hole 25B formed in the stopper 25 and the housing 5A. The four through-holes 13A, the groove 25A in the stopper 25 and the communication hole 25B form the tool suction channel 26.

The other end of the conduit 28 is connected to the negative pressure source 27, and the negative pressure source 27 is configured to operate under the control of the controller. When the bonding system 1 performs a bonding operation, the negative pressure source 27 operates under the control of the controller. During the bonding operation, a negative pressure is applied to the tool suction channel 26, and the bonding tool 14 is held by suction to the lower surface of the tool base 13 (the lower surface of the transparent member 12).

Next, the chip suction channel 23 will be described. A vertical through-hole 12A is drilled in the transparent member 12 forming the lower layer at the center thereof, and a straight groove 12B that is connected to the upper end of the through-hole 12A and reaches the inner surface of the housing 5A is formed in the upper surface of the transparent member 12. A horizontal through-hole 5B is drilled in the housing 5A at such a position that the through-hole 5B faces the outer end of the groove 12B, and one end of the conduit 31 is connected to the through-hole-5B.

The straight groove 12B is formed in the upper surface of the transparent member 12 between two adjacent rows of spots of applied laser beams from the optical fibers as described above (see FIG. 5). The straight groove 12B is completely covered with the lower surface of the transparent member 11, so that the inside space of the straight groove 12B forms a horizontal hole extending outward from the center. The axial hole 12A and the inside space of the groove 12B formed in the transparent member 12 form a connection channel 29 in the tool base 13. That is, the connection channel 29 is a section of the chip suction channel 23 that intersects with the direction of application of the laser beams L emitted from the optical fibers.

A vertical through-hole 14A is drilled in the bonding tool 14 at the center thereof. Once the bonding tool 14 is held by suction to the lower surface of the tool base 13, the through-hole 14A in the bonding tool 14 and the through-hole 12A in the tool base 13 are in communication with each other (the state shown in FIG. 1). In this embodiment, the axial hole 14A in the bonding tool 14, the connection channel 29 and the through-hole 5B in the housing 5A form the chip suction channel 23.

The through-hole 5B in the housing 5A is connected to one end of the conduit 31, and the other end of the conduit 31 is connected to the negative pressure source 32. The negative pressure source 32 is configured to operate under the control of the controller. At a required time, the controller can make the negative pressure source 32 apply a negative pressure to the chip suction channel 23 to hold the electronic component 3 by suction to the lower surface of the bonding tool 14.

With the configuration described above, when the bonding operation is started, the controller makes the negative pressure source 27 apply a negative pressure to the tool suction channel 26, and therefore, the bonding tool 14 is held by suction to the lower surface of the tool base 13. In addition, the controller makes the negative pressure source 31 apply a negative pressure to the chip suction channel 23, and therefore, the electronic component 3 is held by suction to the lower surface of the bonding tool 14.

After that, the controller activates the substrate stage 4. Once the electronic component 3 held to the bonding tool 14 is aligned with the substrate 2, the pressure elevator mechanism 6 lowers the bonding apparatus 5. The electronic component 3 held by suction to the bonding tool 14 then comes into contact with and is pressed against the substrate 2. From this point in time, the controller activates the laser resonator 7, and the laser oscillating elements 21 oscillate the laser beams L. The plurality of laser beams L are guided by the light guide means 8 comprising the plurality of optical fibers f1 to f36 (excluding the optical fibers f15, f16, f21 and f22) into the housing 5A, condensed by the condensing lens 15, vertically reflected by the reflecting mirror 16 and applied to the tool base 13.

As described above, the plurality of optical fibers f1 to f36 are bundled in a matrix. Therefore, when the optical fibers f1 to f36 apply the respective laser beams L to the tool base 13, the spots of applied laser beams L are also arranged in a matrix (see FIGS. 3 and 5).

To prevent scattering of the laser beams L by the through-hole 12A in the tool base 13, the non-irradiation sub-region S2' described above, which is not irradiated with the laser beams L, is provided around the through-hole 12A as shown in FIG. 5.

The straight groove 12B of the connection channel 29 to which a negative pressure is applied is disposed between two adjacent rows of laser beams L, and the intensity profile of the laser beams L is the Gaussian mode as shown in FIG. 4. Therefore, even though the groove 12B is formed in the tool base 13, the thermal loss of the laser beams L through the groove 12B can be minimized.

When the laser beams L are applied to the bonding tool 14 through the tool base 13 comprising the two layers of the transparent members 11 and 12, the laser beams L heat the bonding tool 14 and thereby heat the electronic component 3 and bumps 35 (FIG. 1) disposed at a plurality of points on the lower surface of the electronic component 3.

In this process, the four corner sub-regions S1, which tend to have the lowest temperature, are irradiated with the laser beams of the maximum power from the first laser resonators 7A and 7B, the inner sub-region S2, which tends to have the highest temperature, is irradiated with the laser beams of the minimum power from the second laser resonator 7C, and the outer sub-regions S3, which tend to have a medium temperature, are irradiated with the laser beams of the medium power from the third laser resonator 7D. As a result, the whole of the electronic component 3 is heated as uniformly as possible.

When the bonding operation is finished, the controller instructs the negative pressure source 32 to stop applying the negative pressure to the chip suction channel 23, so that the electronic component 3 is released from the bonding tool 14. After that, the pressure elevator mechanism 6 lifts the bonding apparatus 5, and the bonding system 1 is ready for the next bonding operation.

Figure 6:
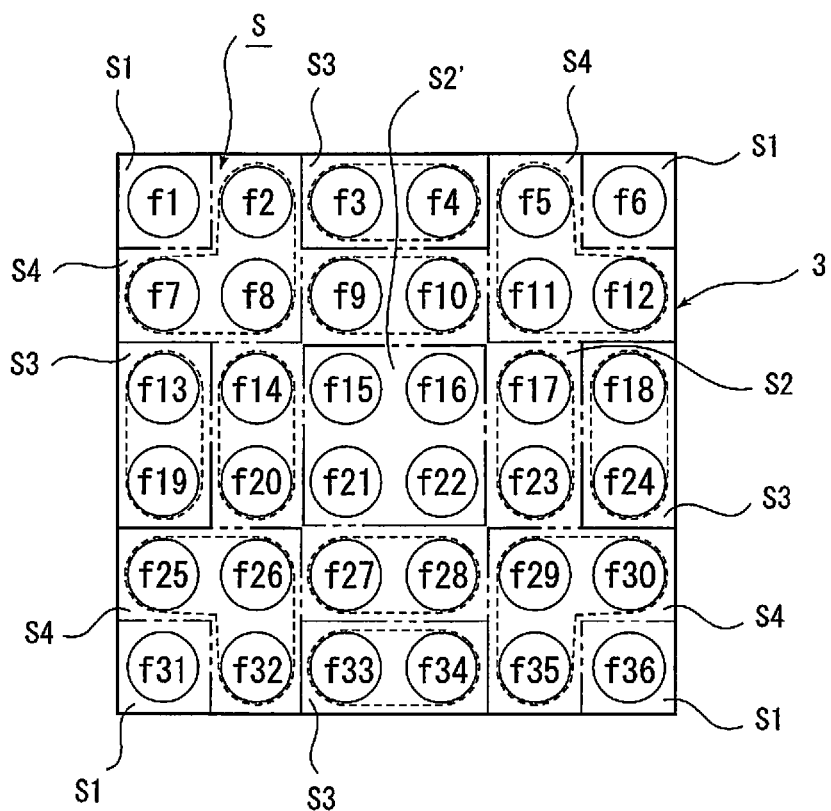
FIG. 6 is a diagram similar to FIG. 3 for illustrating a second embodiment of the present invention.

FIG. 6 is a diagram for illustrating a second embodiment of the present invention. According to the second embodiment, the heating region S is divided into four types of sub-regions.

Specifically, according to this embodiment, the heating region S is divided into four corner sub-regions S1, corner-adjoining sub-regions S4 surrounding the corner sub-regions S1, outer sub-regions S3 that are the outer peripheral sub-regions forming the outer peripheral edges of the electronic component 3 excluding the corner sub-regions S1 and the corner-adjoining sub-regions S4, and the inner sub-region S2 described above.

Figure 7:
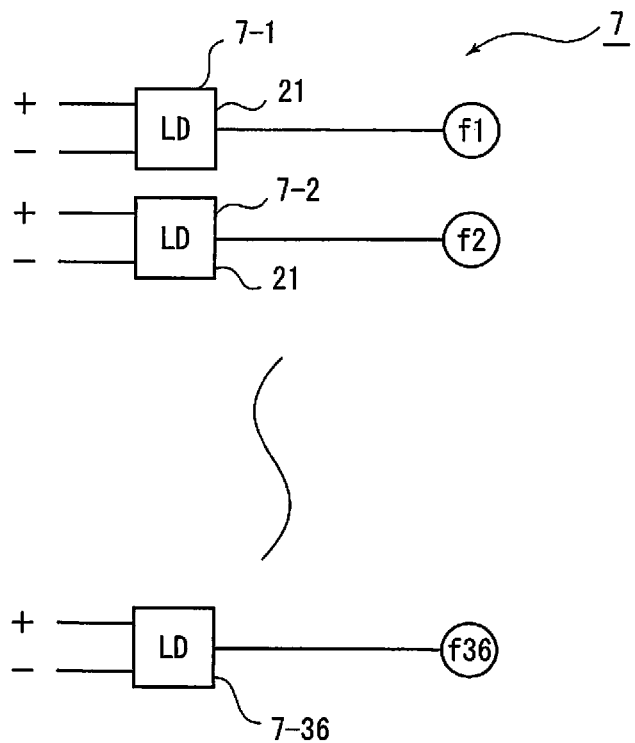
FIG. 7 is a diagram for illustrating an association between the optical fibers f1 to f36 and laser resonators 7-1 to 7-36.

In this embodiment, the 36 optical fibers f1 to f36 are bundled in a line, and the laser beam inlets of the optical fibers f1 to f36 are connected to separate laser resonators 7-1 to 7-36 as shown in FIG. 7. That is, each optical fiber is connected to a different laser resonator, and the laser power of each laser resonator can be independently controlled.

As shown in FIG. 6, of the four corner sub-regions S1, the upper left corner sub-region S1 faces the optical fiber f1, the upper right corner sub-region S1 faces the optical fiber f6, the lower left corner sub-region S1 faces the optical fiber f31, and the lower right corner sub-region S1 faces the optical fiber f36.

The four laser resonators 7-1, 7-6, 7-31 and 7-36 connected to the four optical fibers f1, f6, f31 and f36 are set at the highest power.

Of the four corner-adjoining sub-regions S4 surrounding the corner sub-regions S1, the upper left corner-adjoining sub-region S4 faces three optical fiber F2, F7 and F8, the upper right corner-adjoining sub-region S4 faces three optical fibers f5, f11 and f12, the lower left corner-adjoining sub-region S4 faces three optical fibers f25, f26 and f32, and the lower right corner-adjoining sub-region S4 faces three optical fibers f29, f30 and f35.

The twelve laser resonators 7-2, 7-7, 7-8, 7-5, 7-11, 7-12, 7-25, 7-26, 7-32, 7-29, 7-30 and 7-35 connected to these twelve optical fibers are set at the second highest power.

The outer sub-regions S3 in this embodiment face a total of eight optical fibers f3, f4, f13, f18, f19, f24 and f34, and eight laser resonators 7-3, 7-4, 7-13, 7-18, 7-19, 7-24, 7-33 and 7-34 connected to these eight optical fibers are set at the third highest power.

The inner sub-region S2 in this embodiment faces a total of twelve optical fibers f9, f10, f14, f15, f16, f17, f20, f21, f22, f23, f27 and f28. In this embodiment, as in the first embodiment, the non-irradiation sub-region S2' is provided at the center of the inner sub-region S2, and four optical fibers f15, f16, f21 and f22 face the non-irradiation sub-region S2'.

Therefore, four laser resonators 7-15, 7-16, 7-21 and 7-22 connected to the four optical fibers f15, f16, f21 and f22 facing the non-irradiation sub-region S2' are not activated to oscillate a laser beam. If the bonding system 1 is dedicated for the electronic component 3, of course, the four laser resonators 7-15, 7-16, 7-21 and 7-22 can be omitted.

The eight laser resonators 7-9, 7-10, 7-14, 7-17, 7-20, 7-23, 7-27 and 7-28 connected to a total of eight optical fibers f9, f10, f14, f17, f20, f23, f27 and f28 facing the inner sub-region S2 excluding the non-irradiation sub-region S2' are set at the fourth highest power, or in other words, the lowest power.

The remainder of the configuration is the same as the configuration according to the first embodiment.

In the second embodiment, since the laser power of the laser resonators connected to the optical fibers whose laser beam outlets face the inner sub-region S2 excluding the non-irradiation sub-region S2' is set to be the lowest power, the laser power of the laser resonators connected to the optical fibers whose laser beam outlets face the outer sub-region S3 is set to be the third highest power, the laser power of the laser resonators connected to the optical fibers whose laser beam outlets face the corner-adjoining sub-regions S4 is set to be the second highest power, and the laser power of the laser resonators connected to the optical fibers whose laser beam outlets face the corner sub-regions S1 is set to be the highest power, the whole of the electronic component 3 can be heated as uniformly as possible.

In particular, in this embodiment, since one laser resonator 7-1 to 7-36 is provided for each optical fiber f1 to f36, the temperature of heating can be finely controlled, and therefore, this embodiment is advantageously provided for a small bump, the molten state of which is difficult to control.

In the second embodiment, as an alternative, the laser resonators that oscillate laser beams of the same power may be grouped and connected in series with each other to a common power supply, as in the first embodiment.

In the embodiments described above, the laser beams L heat the bonding tool 14, and the heated bonding tool 14 heats the electronic component 3. As an alternative, however, the bonding tool 14 may be omitted, the electronic component 3 may be held by suction to the tool base 13, and the electronic component 3 may be directly heated by the laser beams L.

In that case, the electronic component 3 can be directly held by suction to the lower surface of the tool base 13 (the lower surface of the transparent member 12) by the negative pressure source 28 stopping applying the negative pressure to the tool suction channel 26 and the negative pressure source 32 applying a negative pressure to the chip suction channel 23. That is, in that case, the tool base 13 serves as the bonding tool 14.

As described above, the bonding systems 1 according to the embodiments described above can be configured to heat the electronic component 3 through the bonding tool 14 with the laser beams L having been transmitted through the tool base 13 or directly heat the electronic component 3 held by suction to the tool base 13. However, of course, regardless of the configuration, the bonding systems 1 can be configured as dedicated systems.

According to a further embodiment, the heating region S can be divided into corner sub-regions S1, outer sub-regions S3 that are the outer peripheral sub-regions forming the outer peripheral edges of the electronic component excluding the corner sub-regions and an inner sub-region S2, the laser power of the laser resonators connected to the optical fibers whose laser beam outlets face the outer sub-regions S3 and the laser power of the laser resonator whose laser beam outlets face the corner sub-regions S1 are set to be equal, and the laser power can be set higher than the laser power of the laser resonators connected to the optical fibers whose laser beam outlets face the inner sub-region.

In that case, the whole of the outer peripheral sub-regions forming the outer peripheral edges of the electronic component including the corner sub-regions is heated with a higher laser power than the inner sub-region, so that the electronic component can be uniformly heated.

What is claimed is:

1. A bonding system, comprising:
    a laser resonator that oscillates a laser beam;
    light guide means that guides the laser beam oscillated by the laser resonator; and
    a tool base through which the laser beam guided by the light guide means is transmitted, the bonding system bonding an electronic component having a polygonal shape to a substrate by heating the electronic component with the laser beam transmitted through the tool base,
    wherein the laser resonator comprises a plurality of laser resonators, the light guide means comprises a plurality of optical fibers each having a laser beam inlet connected to one of the plurality of laser resonators,
    the plurality of laser resonators are associated with a heating region of the electronic component, and the heating region is irradiated with laser beams emitted from laser beam outlets of the plurality of optical fibers connected to the laser resonators and heated at irradiated parts,
    the heating region is divided into at least a corner sub-region at a corner of the electronic component and an inner sub-region inside the electronic component, and a laser power of laser resonators associated with the corner sub-regions is set higher than a laser power of a laser resonator associated with the inner sub-region.

2. The bonding system according to claim 1, wherein the heating region is divided into at least the corner sub-region, a corner-adjoining sub-region surrounding the corner sub-region, an outer sub-region that is an outer peripheral sub-region forming an outer peripheral edge of the electronic component other than the corner sub-region and the corner-adjoining sub-region, and the inner sub-region, and
    the laser powers of the laser resonators are set in such a manner that the laser power of a laser resonator associated with the inner sub-region is set to be the fourth highest laser power, the laser power of a laser resonator associated with the outer sub-region is set to be the third highest laser power, the laser power of a laser resonator associated with the corner-adjoining sub-region is set to be the second highest laser power, and the laser power of a laser resonator associated with the corner sub-region is set to be the highest laser power.

3. The bonding system according to claim 1, wherein the heating region is divided into at least the corner sub-region, an outer sub-region that is an outer peripheral sub-region forming an outer peripheral edge of the electronic component other than the corner sub-region, and the inner sub-region, and
    the laser powers of the laser resonators are set in such a manner that the laser power of a laser resonator associated with the inner sub-region is set to be the third highest laser power, the laser power of a laser resonator associated with the outer sub-region is set to be the second highest laser power, and the laser power of a laser resonators associated with the corner sub-region is set to be the highest laser power.

4. The bonding system according to claim 1, wherein the laser beam outlets of the plurality of optical fibers are arranged in a matrix.

5. The bonding system according to claim 1, wherein the tool base has a suction hole for sucking a central part of the electronic component, and a non-irradiation sub-region including the suction hole is provided in a central part of the inner sub-region.

6. The bonding system according to claim 1, wherein each of the laser resonators comprises a plurality of laser oscillating elements that are connected in series with each other to a common power supply and configured to oscillate laser beams of a same power.

* * * * *